United States Patent

[11] 3,614,648

[72] Inventor Frank Byrne
Cocoa Beach, Fla.
[21] Appl. No. 71,047
[22] Filed Sept. 10, 1970
[45] Patented Oct. 19, 1971
[73] Assignee The United States of America as represented by the Administrator of the National Aeronautics and Space Administration

[54] AUTOMATIC FREQUENCY CONTROL LOOP INCLUDING SYNCHRONOUS SWITCHING CIRCUITS
5 Claims, 5 Drawing Figs.

[52] U.S. Cl. .......... 331/14, 307/257, 307/259, 331/23, 331/30, 331/111, 332/19
[51] Int. Cl. .......... H03b 3/04
[50] Field of Search .......... 331/14, 23, 30; 332/19; 325/148; 307/257, 259

[56] References Cited

UNITED STATES PATENTS

| | | | |
|---|---|---|---|
| 3,191,129 | 6/1965 | Feldman | 331/14 X |
| 3,297,964 | 1/1967 | Hamilton | 331/14 X |
| 3,297,965 | 1/1967 | Chadima | 331/14 X |

*Primary Examiner*—Roy Lake
*Assistant Examiner*—Siegfried H. Grimm
*Attorneys*—James O. Harrell and John R. Manning

ABSTRACT: A circuit for producing precise and exact frequency reference that includes a voltage controlled oscillator, a crystal oscillator, a discriminator, an integrator, and a pair of electronic switches. One electronic switch alternately couples the frequencies from the voltage controlled oscillator and the crystal oscillator to the discriminator which produces alternate DC signals on its output. The second electronic switch produces a composite signal which is fed to the integrator for producing a corrective DC signal that is fed back to the voltage controlled oscillator to cause such to come in alignment with the crystal oscillator.

Figure 1:
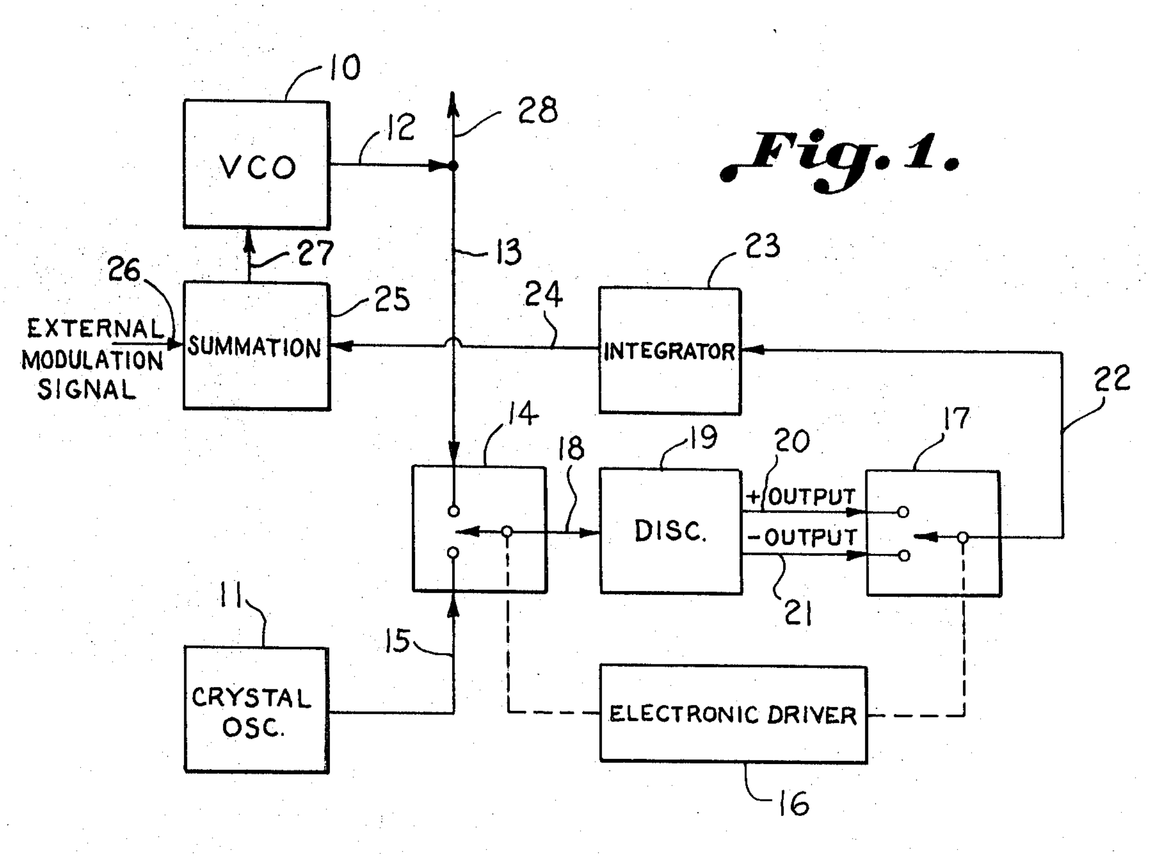

INVENTOR.
FRANK BYRNE

BY James O. Harrell

ATTORNEY

INVENTOR.
FRANK BYRNE
BY James O. Harrell
ATTORNEY

AUTOMATIC FREQUENCY CONTROL LOOP INCLUDING SYNCHRONOUS SWITCHING CIRCUITS

The invention described herein was made by an employee of the United States Government, and may be manufactured and used by or for the Government for Governmental purposes without the payment of any royalties thereon or therefor.

The invention relates to an automatic frequency control device, and more particularly to a device wherein the output frequency of a voltage controlled oscillator is maintained in alignment with the output frequency of a known reference source.

The purpose of this invention is to provide a precise and exact frequency reference for a voltage controlled oscillator. One of the problems in circuits used, heretofore, for providing a frequency reference for voltage controlled oscillators is that they are generally very complicated and cumbersome. In addition, they are very expensive. Another problem with the systems heretofore used, is that they require a large number of adjustments in order to maintain proper operation. It is important that there be a reference frequency for local oscillators in order to properly receive signals from missiles and the like, so that false or inaccurate information will not be received. Such could also be used in the space vehicle as a frequency source for telemetry transmitters.

In accordance with the present invention, it has been found that difficulties encountered with a circuit for providing a frequency reference for a voltage controlled oscillator may be overcome by providing a novel circuit. This circuit aligns the output frequency of a voltage controlled oscillator with the known frequency of a reference source and includes the following basic parts: (1) an input electronic switch having a pair of input terminals and an output terminal, (2) means for connecting the output frequency of the voltage controlled oscillator to one of the inputs of the input electronic switch, (3) means connecting the known frequency from the reference source to the other input terminal of the input electronic switch, (4) the discriminator having an input terminal and a pair of output terminals, (5) means for connecting the output terminal of the input electronic switch to an input terminal of the discriminator, (6) an output electronic switch having a pair of input terminals and an output terminal, (7) means for connecting each of the input terminals of the output electronic switch to a respective output terminal of the discriminator, (8) means for driving the input and output electronic switches in synchronism so that alternate frequency signals from the voltage controlled oscillator and the reference source appear on the output of the input electronic switch and a composite signal which includes alternate signals, each having an amplitude corresponding to the frequency error of a respective frequency signal being applied to the input electronic switch appears on the output terminal of the output electronic switch, (9) an integrator having an input terminal and an output terminal, (10) means for coupling the composite signal to the input terminal of the integrator for producing an integrated error signal on the output terminal thereof, and (11) means for coupling the integrated signal to the voltage controlled oscillator for bringing the output frequency thereof into alignment with the known frequency of the reference source.

Accordingly, it is an important object of the present invention to provide a simple and inexpensive automatic frequency control device wherein, a voltage controlled oscillator is readily compared with a fixed frequency source.

Another important object of the present invention is to provide a simplified frequency control system wherein the output of the voltage controlled oscillator is automatically compared with the output of a given known frequency source to produce a signal indicating a difference therebetween so that such difference can be used to realign the voltage controlled oscillator to the proper frequency.

Figures 2, 3:
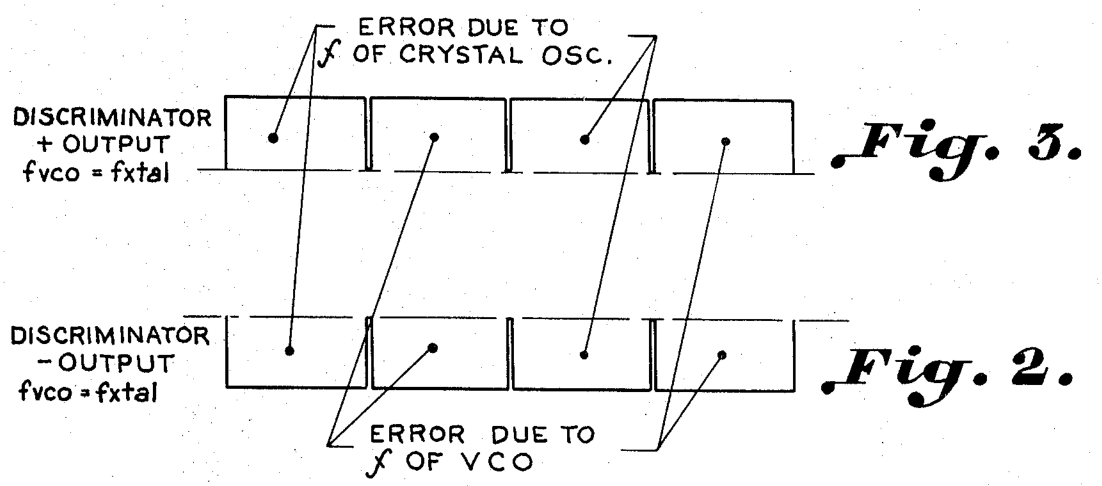
Figure 4:
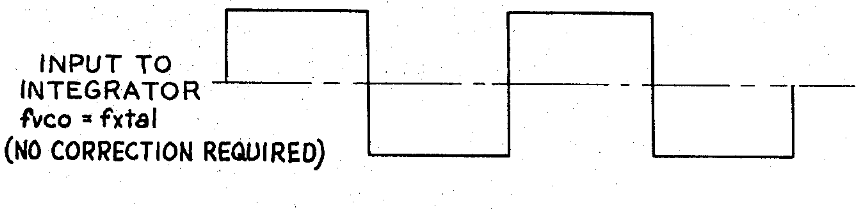
Figure 5:
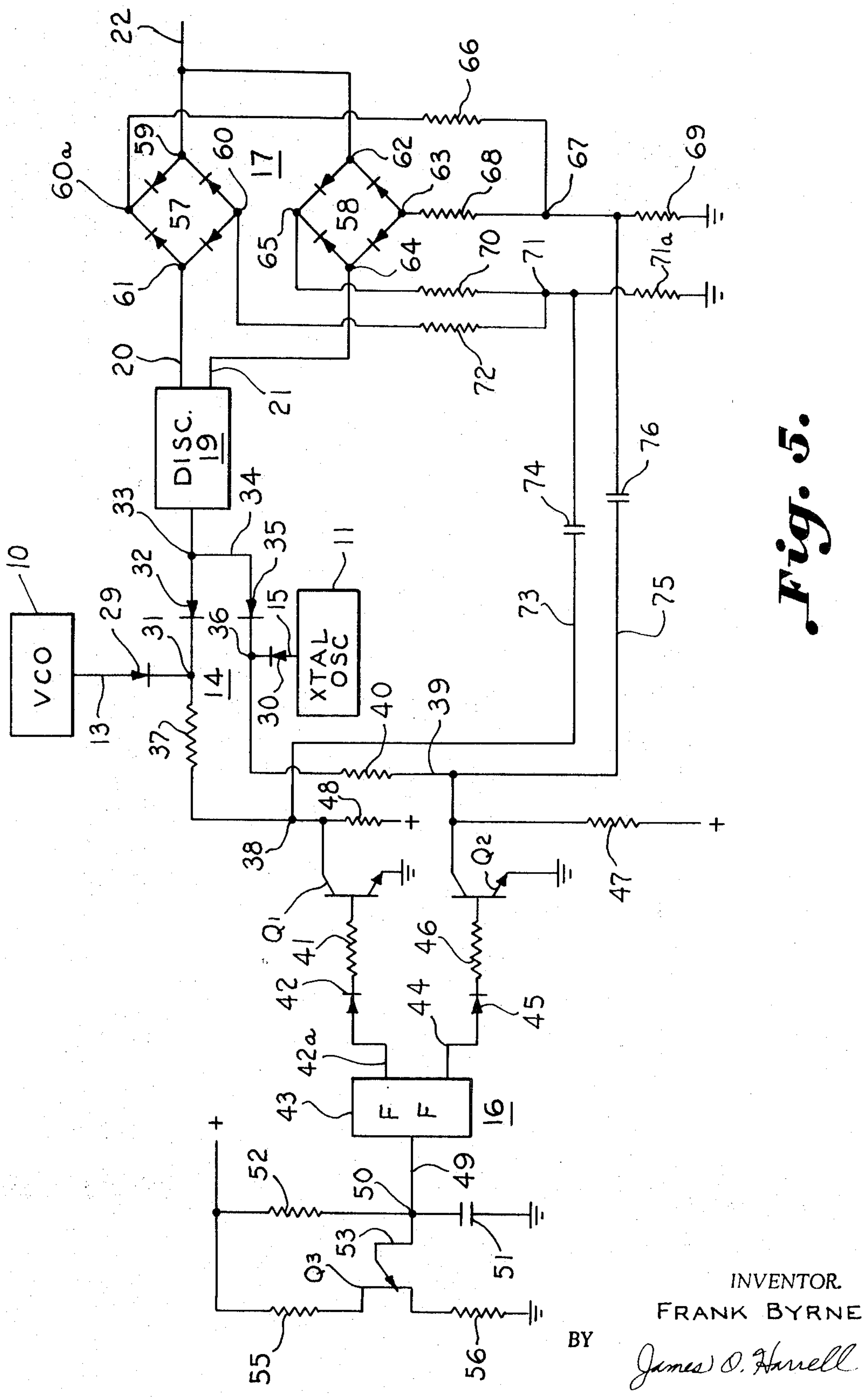

Other objects and advantages of this invention will become more apparent from a reading of the following detailed description and appended claims, taken in conjunction with the accompanying drawings wherein:

FIG. 1 is a block diagram of an automatic frequency control circuit constructed in accordance with the present invention, FIGS. 2 through 4 illustrate various wave forms useful in describing the operation of the circuit illustrated in FIG. 1, and FIG. 5 is a schematic diagram illustrating in detail certain of the components illustrated in block form of FIG. 1.

Referring in more detail to FIG. 1 of the drawings, there is shown a schematic diagram for the simplified automatic frequency control circuit. The reference character 10 generally designates a voltage controlled oscillator whose frequency is to be referenced to a given known frequency source 11, which in one particular embodiment, is a crystal oscillator. The output of the voltage controlled oscillator 10 is fed over lead 12 through lead 13 into an electronic input switch 14. The output of the known crystal oscillator 11 is also fed into the input electronic switch 14. The electronic switch is driven by a driver 16 which is common to both the input switch 14 and an output switch 17. The switch 14, which is illustrated as being mechanical in FIG. 1, is described in more detail in FIG. 5 and such includes four diodes. The switch 14 during one-half cycle connects the output of the voltage controlled oscillator 10 by means of lead 13 to output lead 18. On the other half of the cycle the output from the crystal oscillator 11 is connected to the output terminal of the switch 14. Therefore, on lead 18 there are alternate signals from the voltage controlled oscillator and the known crystal oscillator. These signals are fed to an input terminal of discriminator 19 which produces output voltages proportional to the frequency error of the voltage controlled oscillator and the crystal oscillator so that on the output leads 20 and 21 of the discriminator there are plus and minus error signals proportional to the instantaneous frequency differences between the output of the voltage controlled oscillator and the center frequency of the discriminator. When the electronic switching element 14 is in the other position the instantaneous error between the crystal oscillator 11 and the center frequency of the discriminator 19 will appear on the output leads 20 and 21. These error signals are illustrated in FIGS. 2 and 3, respectively. The electronic switch 17 decommutates the plus and minus error signals appearing on leads 20 and 21 to produce a composite signal, such as illustrated in FIG. 4. It is noted that the output switching element 17 is synchronized with the input switching element 14 by the electronic switch driver 16. The reason for this is that the decommutation must occur in the exact synchronism with the sampling or commutation. The composite error signal appearing on lead 22 is fed into an integrator 23 which integrates the error signal with a time constant appropriate for the application. The output of the integrator 23 appearing on line 24 is a DC control signal which is, in turn, fed into a summation network 25. The signal coming out of integrator 24, which is referred to as integrated error signal, is combined in the summation network 25 with an external modulation signal coming in on lead 26 from any suitable external source. The combined signal is, in turn, fed out of the summation network on lead 27 to correct the frequency of the voltage controlled oscillator so as to make such approach the known or reference frequency of the crystal oscillator 11. The output of the voltage controlled oscillator is also supplied to lead 28 for use in any desired circuit, such as transmitters and receivers.

Referring in more detail to FIG. 5, there is illustrated a schematic diagram of a portion of the circuit which includes the electronic driver 16, the switch 14, discriminator 19 in block form, and the switching element 17. The signals coming from the voltage controlled oscillator 10 and the crystal oscillator 11 are fed through diodes 29 and 30, respectively, which form part of the switch 14. The cathode of diode 29 is connected to junction 31 which is, in turn, connected to the cathode of diode 32 whose anode is connected to junction 33. Junction 33 is connected via lead 34 to the anode of a diode 35 whose cathode is connected to junction 36 which is, in turn, connected to the cathode of diode 30. This diode arrangement forms one switch, generally referred to as input electronic switch 14. Junction 31 is connected through a current limiting resistor 37 to junction 38 which leads into the output of the switch driver 16. The switch driver 16 also produces an output on lead 39 which is fed through a current limiting resistor 40 to junction 36.

The switch driver 16 includes a pair of NPN transistors Q1 and Q2. The collector electrode of transistor Q1 is coupled to lead 38, while the emitter electrode is connected to ground. The base electrode is coupled through resistor 41 to the cathode of a diode 42, whose anode is connected to one output of flip-flop 43. The other output of flip-flop 43 is connected via lead 44 to the anode of diode 45, whose cathode is connected by means of resistor 46 to the base electrode of the transistor Q2. The collector electrode of transistor Q2 is connected to lead 39. The emitter electrode is grounded. The collector electrode of transistor Q2 is also connected to a positive potential by means of resistor 47. A similar connection is provided for the collector electrode of transistor Q1 through resistor 48.

The input of flip-flop 43 is connected via lead 49 to a junction 50. Junction 50 is coupled to ground through a timing capacitor 51. The junction is also connected to a positive potential through a resistor 52. Junction 50 is also connected via lead 53 to the emitter electrode of a unijunction transistor Q3. The bases or base junctions of the unijunction transistor are coupled to the positive potential through resistor 55 and coupled to ground through resistor 56.

The two outputs of the discriminator 20 and 21 are both fed to a respective diode quad switch 57 and 58, respectively. The diode quad switch 57 includes four diodes interposed between junctions 60*a*, 59, 60 and 61, as shown. The diode quad switch 58 includes four diodes which are interposed between junctions 62, 63, 64 and 65. Junction 61 of diode quad switch 57 is, in turn, connected to output lead 20. Whereas, junction 59 of the diode quad switch 57 is connected to lead 22 which is fed to the integrator 23. Junction 60*a* is coupled through resistor 66 to a junction 67. Junction 67, is in turn, coupled through resistor 68 to junction 63 of switch 58. The same junction 67 is coupled through the resistor 69 to ground. Junction 65 is coupled through resistor 70 to junction 71. Junction 71 is, in turn, coupled through the resistor 72 to junction 60 of diode switch 57. It is noted that junction 62 of diode switch 58 is also connected to lead 22 which feeds into the integrator 23. Junction 71 is coupled via lead 73 back to the output terminal 38 of the switch driver transistor Q1 through a coupling capacitor 74, and also to ground via resistor 71*a*. Junction 67 is connected via lead 75 to lead 39 which is coupled to the output of switch driver transistor Q2 through a coupling capacitor 76.

In operation of the circuit illustrated in FIG. 5 the unijunction transistor 54 provides the switching signal for flip-flop 43. When the potential on capacitor 51 builds up to the firing potential of unijunction transistor Q3 such causes the unijunction transistor Q3 to begin conduction. When unijunction transistor Q3 begins conduction it discharges capacitor 51 and causes flip-flop 43 to change state. The setting and resetting of the flip-flop 43 produces a symmetrical square wave signal on each of the output leads 42*a* and 44. These signals are 180° out of phase. The signals on leads 42*a* and 44 are fed into the base electrode of transistors Q1 and Q2 through a driving circuit to cause transistors Q1 and Q2 to alternately conduct producing an output switching wave form in the form of a square wave on leads 38 and 39 which, in turn, drive the diodes 29, 30, 32 and 35 through current limiting resistors 37 and 40. These signals also drive the diode quad switches 57 and 58 through current limiting resistors 66, 68, 70 and 72 and coupling capacitors 74 and 76. Thus it can be seen that the switch 17 is synchronized with the switch 14 so that the switching action occurs simultaneously. When there is a signal coming in on lead 13 from the voltage controlled oscillator into switch 14 switch 57 allows the signal to pass out over lead 20 to lead 22. The next pulse coming from the electronic driver 16 allows the signals coming from the crystal diode over lead 15 to pass through switch 14 into the discriminator through quad diode switch 58 to lead 22.

As can be seen from reviewing the circuit, there are no adjustments that are necessary to effect the operation of the circuit. This enables a more accurate and reliable automatic frequency control apparatus.

While a preferred embodiment of the invention has been described using specific terms, such description is for illustrative purposes only, and it is to be understood that changes and variations may be made without departing from the spirit or scope of the following claims.

1. A circuit for aligning an output frequency of a voltage controlled oscillator with the known frequency of a reference source comprising:
   A. an input electronic switch having a pair of input terminals and an output terminal;
   B. means for connecting the output frequency of said voltage controlled oscillator to one of said inputs of said input electronic switch;
   C. means for connecting said known frequency from said reference source to said other input terminal of said input electronic switch;
   D. a discriminator having an input terminal and a pair of output terminals;
   E. means for connecting said output terminal of said input electronic switch to said input terminal of said discriminator;
   F. an output electronic switch having a pair of input terminals and an output terminal;
   G. means for connecting each of said input terminals of said output electronic switch to a respective output terminal of said discriminator;
   H. means for driving said input and output electronic switches in synchronism so that alternate frequency signals from said voltage controlled oscillator and said reference source appear on the output terminal of said input electronic switch and a composite signal which includes alternate signals each having an amplitude corresponding to the frequency of a respective frequency signal being applied to said input electronic switch appears on the output terminal of said output electronic switch;
   I. an integrator having an input terminal and an output terminal;
   J. means for coupling said composite signal to said input terminal of said integrator for producing an integrated error signal on the output terminal thereof, and
   K. means for coupling said integrated error signal to said voltage controlled oscillator for bringing the output frequency thereof into alignment with said known frequency of said reference source.

2. The circuit as set forth in claim 1 wherein said means for coupling said integrated error signal to said voltage controlled oscillator includes:
   A. a summation circuit having a pair of input terminals and an output terminal;
   B. an external modulation signal coupled to one of said input terminals of said summation circuit
   C. said integrated error signal being coupled to said other input terminal of said summation circuit;
   D. said summation circuit combining said external modulation signal with said integrated error signal to produce a combined signal; and
   E. means for coupling said output terminal of said summation circuit to said voltage controlled oscillator so that said combined signal brings said output frequency of said voltage controlled oscillator into alignment with said known frequency.

3. The circuit as set forth in claim 2 wherein said reference source is a crystal oscillator.

4. The circuit as set forth in claim 1 wherein said means for driving said input and output electronic switches includes:
   A. a flip-flop having an input terminal and a pair of output terminals;

B. means for supplying a signal to said input terminal of said flip-flop for causing said flip-flop to alternately change from a set to a reset state wherein alternate output signals are placed on the output terminals of said flip-flop;

C. a pair of transistors each having a control electrode and an output electrode;

D. means for connecting the control electrode of each of said transistor to a respective output terminal of said flip-flop for alternately turning said transistors on, and E. means for coupling said output terminal of said transistors to said input and output a electronic gates whereby said input and output switches are driven in synchronism.

5. A circuit for aligning an output frequency of a voltage controlled oscillator with the known frequency of a reference source comprising:

A. an input electronic switch having a pair of input terminals and an output terminal;

B. means for connecting the output frequency of said voltage controlled oscillator to one of said inputs of said input electronic switch;

C. means for connecting said known frequency from said reference source to said other input terminal of said input electronic switch;

D. a discriminator having an input terminal and a pair of output terminals;

E. means for connecting said output terminal of said input electronic switch to said input terminal of said discriminator;

F. an output electronic switch including a pair of diode bridges;

G. each of said bridges including four diodes coupled together with junctions therebetween;

H. means for coupling each of said output terminals of said discriminator to a first junction of a respective diode bridge;

I. means for coupling a second junction of each of said diode bridges together to form an output terminal for said output electronic switch;

J. means coupled to said input electronic switch and a third junction of each of said diode bridges for driving said input and output electronic switches in synchronism so that a composite signal which includes alternate signals each having an amplitude and polarity corresponding to the frequency of a respective frequency signal being applied to said input electronic switch appears on the output terminal of said output electronic switch;

K. an integrator having an input terminal and an output terminal;

L. means for coupling said composite signal to said input terminal of said integrator for producing an integrated error signal on the output terminal thereof, and M. means for coupling said integrated error signal to said voltage controlled oscillator for bringing the output frequency thereof into alignment with said known frequency of said reference source.